(12) United States Patent
Spitz et al.

(10) Patent No.: US 7,170,104 B2
(45) Date of Patent: Jan. 30, 2007

(54) ARRANGEMENT WITH P-DOPED AND N-DOPED SEMICONDUCTOR LAYERS AND METHOD FOR PRODUCING THE SAME

(75) Inventors: Richard Spitz, Reutlingen (DE); Alfred Goerlach, Kusterdingen (DE)

(73) Assignee: Robert Bosch GmbH, Stuttgart (DE)

(*) Notice: Subject to any disclaimer, the term of this patent is extended or adjusted under 35 U.S.C. 154(b) by 136 days.

(21) Appl. No.: 10/070,521

(22) PCT Filed: Jun. 22, 2001

(86) PCT No.: PCT/DE01/02309

§ 371 (c)(1),
(2), (4) Date: Jul. 8, 2002

(87) PCT Pub. No.: WO02/03473

PCT Pub. Date: Jan. 10, 2002

(65) Prior Publication Data

US 2002/0179924 A1     Dec. 5, 2002

(30) Foreign Application Priority Data

Jul. 5, 2000 (DE) .................................. 10032543

(51) Int. Cl.
   *H01L 29/866* (2006.01)
(52) U.S. Cl. ................................ 257/106; 257/603
(58) Field of Classification Search ............... 257/106, 257/603
   See application file for complete search history.

(56) References Cited

U.S. PATENT DOCUMENTS

| 3,015,762 A | | 1/1962 | Shockley |
| 3,263,092 A | * | 7/1966 | Knauss ..................... 323/311 |
| 3,416,046 A | * | 12/1968 | Dickson, Jr. et al. ....... 257/106 |
| 3,953,254 A | | 4/1976 | Valdman |
| 4,040,171 A | | 8/1977 | Cline et al. |
| 4,200,877 A | | 4/1980 | Ogawa et al. |
| 4,554,568 A | | 11/1985 | Champon et al. |
| 5,973,359 A | | 10/1999 | Kobayashi et al. |

FOREIGN PATENT DOCUMENTS

| JP | 58 021 374 | 2/1983 |
| JP | 03 195 054 | 8/1991 |

* cited by examiner

*Primary Examiner*—Jerome Jackson
(74) *Attorney, Agent, or Firm*—Kenyon & Kenyon LLP

(57) ABSTRACT

An arrangement having p-doped semiconductor layers and n-doped semiconductor layers which exhibits transitions between the p-doped semiconductor layers and n-doped semiconductor layers, the transitions displaying a Zener breakdown upon application of a voltage characteristic of a transition, a plurality of transitions between p-doped semiconductor layers and n-doped semiconductor layers being present, and the characteristic voltages additively make up the breakdown voltage of the entire arrangement. Also described is a method for manufacturing the arrangement.

13 Claims, 4 Drawing Sheets

STAND DER TECHNIK

STAND DER TECHNIK

ARRANGEMENT WITH P-DOPED AND N-DOPED SEMICONDUCTOR LAYERS AND METHOD FOR PRODUCING THE SAME

FIELD OF THE INVENTION

The present invention relates to an arrangement having p-doped and n-doped semiconductor layers which exhibits transitions between the p-doped semiconductor layers and n-doped semiconductor layers, the transitions displaying a Zener breakdown upon application of a voltage characteristic of a transition. The present invention further concerns a method for manufacturing the arrangement according to the present invention.

BACKGROUND OF THE INVENTION

The use of semiconductor components to limit voltages is known. Zener diodes (Z diodes), in particular, are used for this purpose. If Zener diodes are operated in the blocking or reverse direction, they display a pronounced breakdown behavior at comparatively low breakdown voltages. The value of the breakdown voltage of a diode depends substantially on the doping concentration of the semiconductor material. In highly doped diodes, a very narrow barrier layer forms, so that high electrical field strengths above the p-n transition are present upon application of even small reverse voltages.

If the field strength exceeds a value of approximately $10^6$ V/cm, valence electrons in the vicinity of the almost charge-carrier-free p-n transition can be pulled out of their bonds. In the band model, this effect is represented as tunneling through the forbidden band. At low voltages below the breakdown voltage (also called the Zener voltage), only the (usually negligibly low) reverse current flows. When the Zener voltage is reached, the current rises sharply due to charge carrier emission, thus preventing any further increase in voltage. At breakdown voltages below 4.5 V, the result is a "pure Zener" breakdown. At higher breakdown voltages there is another competing breakdown effect, namely the so-called avalanche breakdown. This predominates at voltages above 7 V, and results substantially from avalanching impact ionizations in the semiconductor. Because of its defined and reversible breakdown, a Zener diode is suitable as a voltage limiter. If two Zener diodes are connected together in anti-serial fashion, i.e. in series but with opposite polarity, symmetrical breakdown behavior will be obtained.

A circuit of this kind is illustrated in FIG. 6, which depicts a first Zener diode 110 and a second Zener diode 112 connected anti-serially. Arrangements of this kind are used for voltage limiting in order to limit both polarities of a voltage applied to contacts 114, 116.

FIG. 7 shows the corresponding current/voltage characteristic of the circuit depicted in FIG. 6. In the diagram of FIG. 7, the current flowing through Zener diodes 110, 112 is plotted against the voltage applied to contacts 114, 116. Ignoring path resistances and the rise in breakdown voltage resulting from self-heating, the breakdown voltage of the arrangement is UZ1+UF, where UZ1 denotes the breakdown voltage of one of the Zener diodes (which in the present case are assumed to be identical) and UF is the voltage drop of a diode in the forward direction. If a voltage limiting circuit of this kind is to be designed for higher limit voltages, however, the positive breakdown voltage temperature response, as seen in FIG. 7, occurs. In FIG. 7, a solid line shows a characteristic at room temperature (RT) and a dashed line shows a characteristic at much higher temperature (HT). The positive temperature response seen here results principally from the fact that in diodes designed for higher breakdown voltages, avalanche breakdown is predominant.

The temperature dependence of the characteristic shown in FIG. 7 is undesirable. The voltage limiting circuit of FIG. 6 additionally has the disadvantage that two separate components are needed to implement it, entailing additional circuit complexity.

SUMMARY OF THE INVENTION

In an example embodiment of the present invention a plurality of transitions between p-doped semiconductor layers and n-doped semiconductor layers are present; and characteristic voltages additively make up a breakdown voltage of the entire arrangement. Through the present invention it is no longer necessary to use two separate components to bring about voltage limitation for both polarities of the voltage. Instead, a single arrangement having multiple transitions between p-doped semiconductor layers and n-doped semiconductor layers provides voltage limitation for both polarities. Since the characteristic voltages of the transitions at which the transitions exhibit a Zener breakdown moreover additively make up the breakdown voltage of the entire arrangement, it is possible to select a low level for the individual breakdown voltages and nevertheless, because of the addition of the individual breakdown voltages, effect limitation to a comparatively high voltage. Since the Zener effect greatly predominates at the small characteristic voltages of the individual transitions (which for example can be 4.2 V), (i.e. avalanche breakdown still plays no role or only a subordinate role), a practically temperature-independent characteristic curve may be made available despite the high limit voltage that is provided.

The semiconductor layers may be highly doped. A high level of doping results in a low breakdown voltage and thus, in the desired temperature, independence of the apparatus.

The semiconductor layers may exhibit constant doping allowing simple manufacture. With constant doping the breakdown voltage is moreover calculable because of the identical properties of the transitions between layers.

Another embodiment provides p-doped semiconductor layers and n-doped semiconductor layers which are doped at the same concentration. This results in a uniform configuration of the depletion zone in both the n-doped semiconductor layers and the p-doped semiconductor layers. This allows the layer sequence to be configured uniformly.

Another embodiment provides for the p-doped semiconductor layers to form at least two groups that are doped at different concentrations. This makes it possible to obtain a characteristic that is asymmetrical with respect to voltage polarity, unlike the case of uniform doping of all p– semiconductor layers and all – semiconductor layers, which yields a symmetrical characteristic. Voltage limitations that differ depending on the polarity of the voltage can thus be made available.

For the same reason, another embodiment provides n-doped semiconductor layers to form at least two groups that are doped at different concentrations.

Another embodiment provides for the semiconductor layers to be arranged on an n-doped substrate.

Another embodiment provides for the semiconductor layers to be arranged on a p-doped substrate. In this embodiment there is no dependence on a specific doping of the substrate, thereby making the arrangement flexible in terms of manufacture and utilization.

The doping type of the semiconductor layer farthest away from the substrate may correspond to the doping type of the substrate.

The doping type of the semiconductor layer farthest away from the substrate may be different from the doping type of the substrate providing flexibility in terms of the manufacture and field of application of the arrangement, and no limitation to a specific doping type for the outermost semiconductor layers.

The semiconductor layers may have a thickness of approximately 4 μm. Such a thickness is suitable, i.e. sufficiently thick, in the context of the feasible breakthrough voltages of the individual transitions and the depletion zone thicknesses related thereto. The thickness prevents the minority charge carriers injected through the transitions polarized in the forward direction from reaching a space charge zone of an adjacent transition that is reverse-polarized. The entire arrangement would "fire" (thyristor effect) if not designed in this way.

The substrate may have a thickness of approximately 500 μm. A substrate thickness on this order ensures, inter alia, sufficient mechanical stability.

The doping concentration may be provided in the region of $2 \times 10^{19}$ atoms/cm$^3$. At such a high doping concentration, a Zener effect is obtained in each transition at the desired low Zener voltage, and thus with a correspondingly low temperature dependence.

In a specific embodiment, approximately ten transitions between p-doped semiconductor layers and n-doped semiconductor layers are provided. At Zener voltages in the region of 4.2 V and conducting voltages in the region of 0.7, an overall breakdown voltage of, for example, 50 V is obtained, without significant temperature dependence. If this level of voltage limitation were to be implemented with a conventional design, i.e. with individual Zener diodes, the overwhelming dominance of the avalanche effect would result in a considerable and in some cases intolerable temperature dependence.

The arrangement may have on its upper side and lower side respective metal contacts which extend over their entire surface. The arrangement is thereby prepared for the further processing that is usually performed on semiconductor components.

The semiconductor layers may be silicon layers. The high doping levels and the desired layer structure may be brought about using silicon.

The present invention further relates to a method for manufacturing an arrangement having p-doped and n-doped semiconductor layers which exhibits transitions between the p-doped semiconductor layers and n-doped semiconductor layers, the transitions displaying a Zener breakdown upon application of a voltage characteristic of a transition, a plurality of transitions between p-doped semiconductor layers and n-doped semiconductor layers being present, and the characteristic voltages additively making up the breakdown voltage of the entire arrangement, the method comprising application of the semiconductor layers by epitaxy. Epitaxy provides a suitable method for building up layer arrangements that constitute the present invention.

The epitaxy may take place at approximately 1180° C. This temperature allows defect-free layer formation.

The epitaxy may be performed at a growth rate of approximately 4 μm/min. This rate ensures a high-quality layer structure with a sufficiently rapid manufacturing method.

Metal contacts may be sputtered onto the upper side and lower side of the arrangement. By way of these metal contacts, which may cover the entire upper side and the entire lower side of the arrangement, the arrangement is prepared for further processing. The sputtering method has proven particularly reliable for the application of thin metal layers.

The arrangement may be divided into individual chips after the metal contacts are sputtered on. For example, a silicon substrate that is initially used may have a diameter of 125 mm. The chips resulting from the method, which are produced, for example, with the use of a circular saw, may then have a surface area of, for example, 20 mm$^2$.

The edges of the chips may be removed. If the chips are produced, for example, by a sawing operation, crystal disruptions that have a negative effect on the electrical properties of the component are created at the chip edge. This disrupted semiconductor region at the chip edge is then removed, for example to a depth of 50 μm. This can be achieved, for example, by etching in KOH. Etching is often performed after the chip has been soldered at its front and rear sides into a copper housing. Further packaging is then performed in a manner common in diode technology.

In addition to construction of the layer arrangement by epitaxy, thin silicon disks may be assembled by wafer bonding. Variability thus exists in terms of manufacture.

With a corresponding layer arrangement made up of p-doped and n-doped semiconductor layers, bipolar voltage limitation are available with negligible temperature dependence. The breakdown voltage of individual p-n transitions may be selected, through appropriate doping, so that practically only Zener breakdown occurs. Because the layer arrangement is configured in such a way that the breakdown voltages of the individual p-n transitions additively make up the breakdown voltage of the overall arrangement, voltage limitation may be achieved even for high voltages with a low temperature dependence.

DETAILED DESCRIPTION

Figure 1:
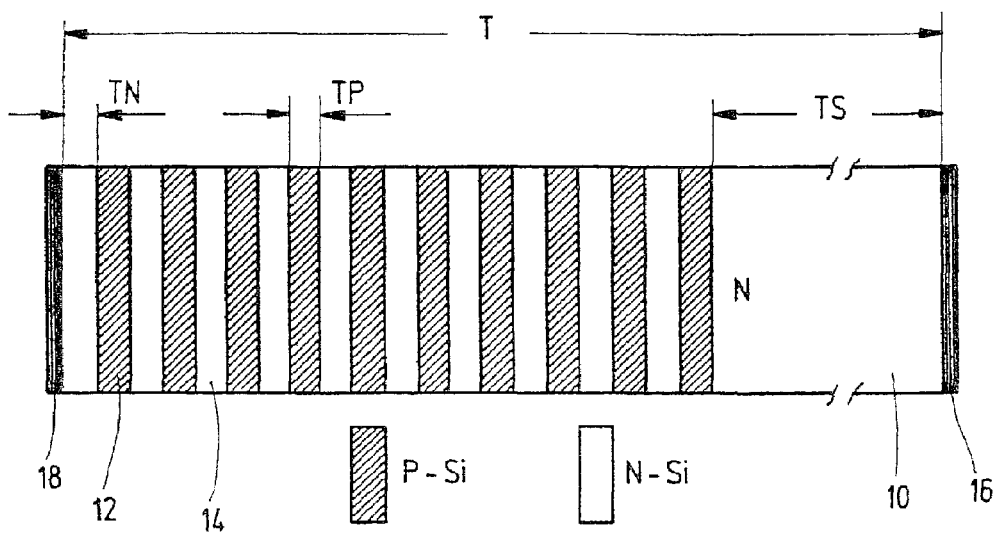
FIG. 1 is a cross sectional view of an arrangement according to the present invention.

FIG. 1 schematically shows a cross section of an arrangement according to the present invention. A plurality of p-doped semiconductor layers 12 and n-doped semiconductor layers 14 are arranged on an n-doped silicon substrate 10. A plurality of semiconductor transitions are present between p-doped semiconductor layers 12 and n-doped semiconductor layers 14. P-doped semiconductor layers 12 have a thickness TP, while n-doped semiconductor layers have a thickness TN. In the present case, thicknesses TP and TN are approximately identical and are approximately 4 μm. The substrate has a thickness TS of approx. 525 μm in the present example. Since a total of ten p-doped semiconductor layers and ten n-doped semiconductor layers 14 are arranged on substrate 10, the total thickness T of the arrangement resulting from these data is 605 µm. In the present example, silicon is selected as the semiconductor. Located on n-doped substrate 10 and the uppermost semiconductor layer, which in the present case is an n-doped semiconductor layer 14, are metal contacts 16, 18 that were applied with a sputtering procedure. Semiconductor layers 12, 14 each have a constant doping level of approx. $2\times10^{19}$ atoms/cm$^3$. Layers 12, 14 were applied by epitaxy onto the respective layer beneath. In an example embodiment, the epitaxy takes place in such a way that a temperature of 1180° C. and a growth rate of 4 µm/min is selected. In the present example as shown in FIG. 1, the layer arrangement is selected that the uppermost layer and bottommost layer (substrate) have the same doping type, in the present case n-doping. The two outer semiconductor layers may also exhibit p-doping. The outer layers may have different doping types, in the context of both an n-type substrate and a p-type substrate.

Figure 2:
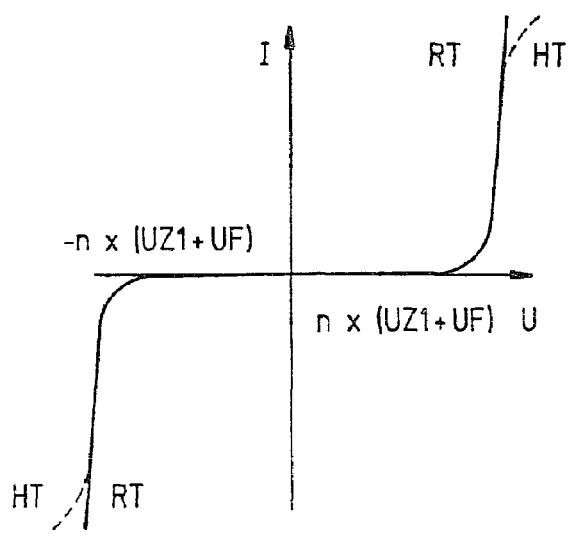
FIG. 2 is a characteristic curve of an arrangement as shown in FIG. 1.

FIG. 2 shows in simplified fashion a characteristic curve of the arrangement shown in FIG. 1. If a voltage U that is positive as compared to electrode 16 is applied to metal electrode 18, no current (other than a reverse current) flows until reverse voltage UZ is reached. If an attempt is made to increase voltage U even further, the current through the arrangement rises sharply as a result of the Zener breakdowns at the individual transitions between the semiconductor layers. Since the arrangement is symmetrically constructed, reversing the polarity of the applied voltage U results in the same electrical behavior with the opposite sign. Assuming n p-doped epitaxial layers and n-doped epitaxial layers, the equation for the breakdown voltage UZ is:

$$UZ=n*(UZ1+UF)$$

where UZ1 is the breakdown voltage of an individual transition, and UF is the forward voltage of an individual p-n diode. The solid line in FIG. 2 shows the current/voltage behavior of the arrangement at room temperature (RT). The dashed line shows the behavior at higher temperatures (HT). Until very high currents are reached, temperature has practically no influence on the curve. Only at very high current densities, approximately in the region above 200 A/cm$^2$, is a non-negligible positive temperature coefficient once again present.

Figure 3:
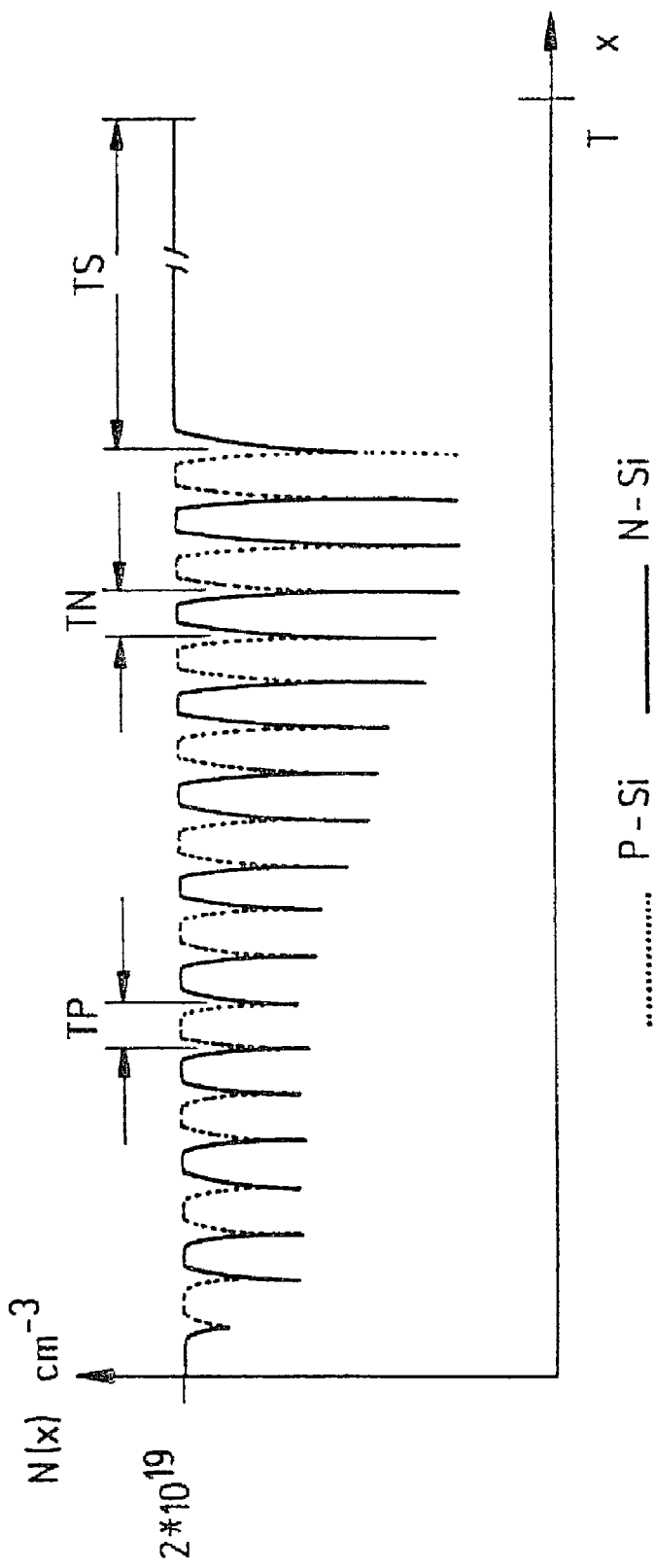
FIG. 3 is a doping profile of an arrangement as shown in FIG. 1.

FIG. 3 depicts the doping profile of the arrangement shown in FIG. 1, the number density of doping atoms N being plotted against location x. The solid lines denote n-doped silicon, and the dashed lines denote p-doped silicon. The left side of the diagram in FIG. 3 corresponds to the n-doped silicon layer of FIG. 1 that is adjacent to metal electrode 18, while the right side of the diagram in FIG. 3 corresponds to substrate 10 in FIG. 1 that is adjacent to metal electrode 16 of FIG. 1. A constant doping concentration of $2\times10^{19}$ atoms/cm$^3$ is present.

Figure 4:
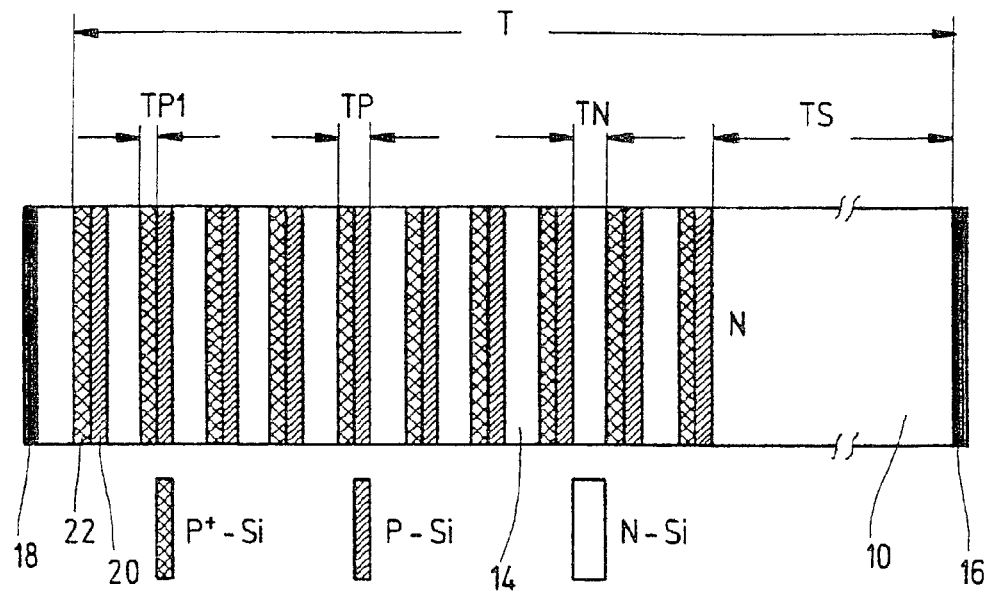
FIG. 4 is a cross sectional view of a further embodiment of an arrangement according to the present invention.

FIG. 4 schematically shows a cross section of a further embodiment of an arrangement according to the present invention that results in voltage limitation regardless of the voltage polarity. As previously stated, the arrangement shown in FIG. 1 has a characteristic curve that is symmetrical in terms of the polarity of the applied voltage. The arrangement depicted in FIG. 4, however, yields an asymmetrical characteristic curve. The particular feature of this arrangement is that two types of p-doped semiconductor layers are present. A first p-doped semiconductor layer 20 has a lower doping concentration than a second p+-doped semiconductor layer 22. The doping concentration of the n-type semiconductor layers is uniform. This yields diodes having different breakdown voltages, corresponding to the n–(p+p) and (p+p)–n transitions. When the diodes are loaded in the reverse direction, the breakdown voltage UZ1 of the (p+p)n diode is greater than the breakdown voltage UZ2 of the n(p+p) diode. Assuming n transitions, a voltage at metal contact 18 that is positive with respect to metal contact 16 results in a breakdown voltage $$UZ=n*(UZ2+UF).$$

If the polarity of the voltage is reversed, the resulting breakdown voltage is $$UZ=-n*(UZ1+UF).$$

The arrangement shown in FIG. 4 is variable in principle in terms of the outermost semiconductor layers and in terms of doping types. For example, a p-type substrate can also be used instead of an n-type substrate. In the case of a p-type substrate, more highly doped n+-type layers and less highly doped n-type layers would correspondingly be used. The outermost layers of the semiconductor arrangement can in turn be identical or different in terms of doping type.

Figure 5:
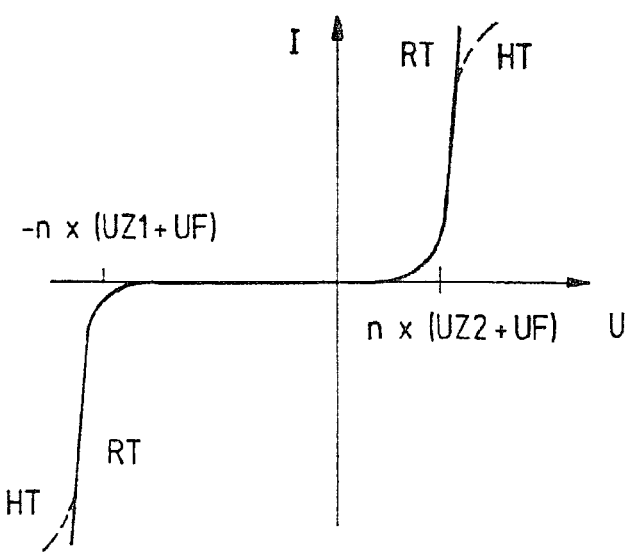
FIG. 5 is a characteristic curve of an arrangement as shown in FIG. 4.
Figure 6:
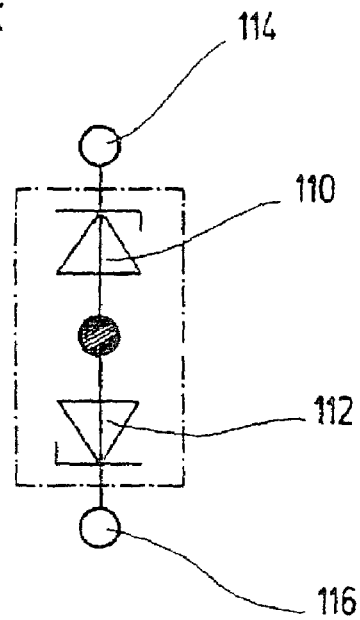
FIG. 6 is a schematic layout of a circuit according to the existing art.
Figure 7:
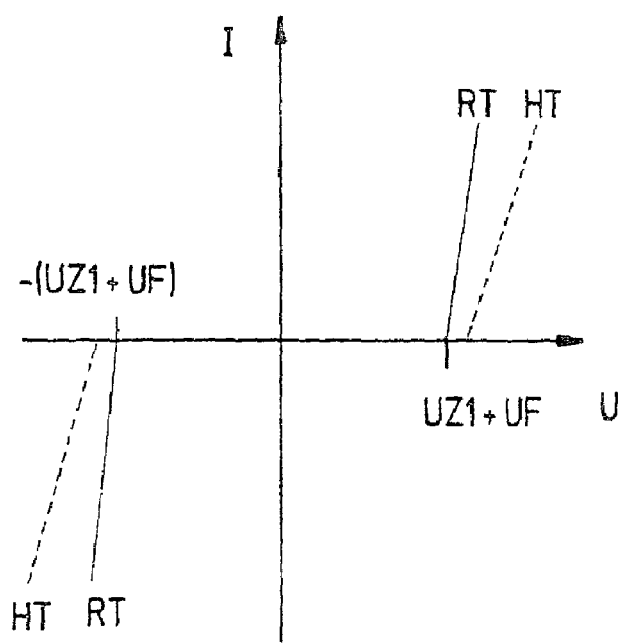
FIG. 7 is a characteristic curve of the arrangement as shown in FIG. 6.

FIG. 5 shows a characteristic curve of an arrangement as shown in FIG. 4. With suitable dimensioning in terms of both geometry and concentrations, the result is practically temperature-independent characteristic curves as depicted in FIG. 5. FIG. 5 corresponds in a general configuration to FIG. 2, while using the asymmetrical curve.

The description above of the exemplary embodiments of the present invention is provided for illustrative purposes only, and not for purposes of limiting the invention. A variety of changes and modifications are possible in the context of the present invention without departing from the scope of the invention or its equivalents.

What is claimed is:

1. An arrangement, comprising:
    p-doped semiconductor layers;
    n-doped semiconductor layers; and
    a plurality of transitions arranged between the p-doped semiconductor layers and the n-doped semiconductor layers, the transitions displaying a Zener breakdown upon application of a characteristic voltage for each of the transitions, wherein:
        the characteristic voltages of the transitions additively correspond to a breakdown voltage of the arrangement,
        the p-doped semiconductor layers and the n-doped semiconductor layers are highly doped,
        the p-doped semiconductor layers form at least two groups doped at different concentrations, a highly doped layer of the p-doped semiconductor layers being doped at about $2\times10^{18}$ atoms/cm$^3$,
        the n-doped semiconductor layers form at least two groups that are doped at different concentrations, a highly doped layer of the n-doped semiconductor layers being doped at about $2\times10^{18}$ atoms/cm$^3$,
        the p-doped semiconductor layers and the n-doped semiconductor layers exhibit a constant doping, and
        the p-doped semiconductor layers and the n-doped semiconductor layers are doped at a same concentration, wherein the p-doped semiconductor layers and the n-doped semiconductor layers have a thickness of approximately 4 µm.

2. The arrangement according to claim 1, further comprising:
an n-doped substrate on which are arranged the p-doped semiconductor layers and the n-doped semiconductor layers.

3. The arrangement according to claim 2, wherein a doping type of a semiconductor layer farthest away from the n-doped substrate corresponds to a doping type of the n-doped substrate.

4. The arrangement according to claim 2, wherein a doping type of a semiconductor layer farthest away from the n-doped substrate is different than a doping type of the n-doped substrate.

5. The arrangement according to claim 2, wherein the n-doped substrate has a thickness of approximately 500 μm.

6. The arrangement according to claim 1, further comprising:
a p-doped substrate on which are arranged the p-doped semiconductor layers and the n-doped semiconductor layers.

7. The arrangement according to claim 6, wherein a doping type of a semiconductor layer farthest away from the p-doped substrate corresponds to a doping type of the p-doped substrate.

8. The arrangement according to claim 6, wherein a doping type of a semiconductor layer farthest away from the p-doped substrate is different than a doping type of the p-doped substrate.

9. The arrangement according to claim 7, wherein the p-doped substrate has a thickness of approximately 500 μm.

10. The arrangement according to claim 1, wherein a concentration of doping for the p-doped semiconductor layers and the n-doped semiconductor layers is approximately $2 \times 10^{19}$ atoms/cm$^3$.

11. The arrangement according to claim 1, wherein ten transitions are provided between the p-doped semiconductor layers and the n-doped semiconductor layers.

12. The arrangement according to claim 1, further comprising:
metal contacts arranged over an entire respective surface of an upper side and a lower side of the arrangement.

13. The arrangement according to claim 1, wherein the n-doped semiconductor layers and the p-doped semiconductor layers are silicon layers.

* * * * *